United States Patent [19]
Liao

[11] Patent Number: 6,110,795
[45] Date of Patent: Aug. 29, 2000

[54] METHOD OF FABRICATING SHALLOW TRENCH ISOLATION

[75] Inventor: Kuan-Yang Liao, Taipei, Taiwan

[73] Assignee: United Silicon Incorporated, Hsinchu, Taiwan

[21] Appl. No.: 09/103,384

[22] Filed: Jun. 24, 1998

[30] Foreign Application Priority Data

May 21, 1998 [TW] Taiwan ................................. 87107911

[51] Int. Cl.⁷ ................................................... H01L 21/76
[52] U.S. Cl. ........................ 438/424; 438/400; 438/438; 438/435; 438/238; 257/647
[58] Field of Search ................................... 438/400, 436, 438/438, 424, 435, 238; 257/647

[56] References Cited

U.S. PATENT DOCUMENTS

| | | | |
|---|---|---|---|
| 5,189,501 | 2/1993 | Kawamura et al. | 257/647 |
| 5,516,729 | 5/1996 | Dawson et al. | 437/228 |
| 5,915,175 | 6/1999 | Wise | 438/238 |
| 5,937,308 | 8/1999 | Gardner et al. | 438/424 |
| 5,981,354 | 11/1999 | Spikes et al. | 438/424 |

*Primary Examiner*—Charles Bowers
*Assistant Examiner*—V. Yevsikov
*Attorney, Agent, or Firm*—Thomas, Kayden, Horstemeyer & Risley

[57] ABSTRACT

An method of fabricating a shallow trench isolation. A semiconductor substrate having pad oxide layer and a hard mask layer is provided. The pad oxide layer and the hard mask layer are defined to expose a part of the substrate. The exposed substrate is etched to form a trench therewithin. An isolation layer is formed to fill the trench. The isolation layer is planarized by chemical mechanical polishing with the hard mask layer as an stop layer, so that a micro-scratch is formed on a surface of the isolation within the trench. A sacrificial layer is formed on the isolation layer and the hard mask layer. The micro-scratch is thus filled with the sacrificial layer. Using the hard mask as an etch stop, the sacrificial layer is etched back. Since the etching rate of the sacrificial layer is the same as or lower than the isolation layer within the trench, the formation of the micro-scratch is suppressed during the etching back process.

7 Claims, 4 Drawing Sheets ically,
METHOD OF FABRICATING SHALLOW TRENCH ISOLATION

CROSS-REFERENCE TO RELATED APPLICATION

This application claims the priority benefit of Taiwan application serial no. 87107911, filed May 21, 1998, the full disclosure of which is incorporated herein by reference.

BACKGROUND OF THE INVENTION

1. Field of the Invention

The invention relates in general to a method of fabricating a shallow isolation trench isolation (STI), and more particularly, to a method of fabricating a shallow isolation trench isolation and mending micro-scratch caused by chemical mechanical polishing (CMP).

2. Description of the Related Art

FIG. 1A to FIG. 1D shows a conventional method of fabricating a shallow trench isolation. In FIG. 1A, on a semiconductor substrate 10, a pad oxide layer 12 and a silicon oxide layer 14 are formed sequentially. The silicon nitride 14 and the pad oxide layer 12 are defined and denoted as 14a and 12a to expose a part of the substrate 10. The exposed substrate 10 is etched to formed a trench 16 as shown in FIG. 1B.

In FIG. 1C, an oxide layer 18 is formed over the substrate 10 and fills the trench 16. Using the silicon nitride layer 14a as an etch stop, the oxide layer 18 is etched back by chemical mechanical polishing. A shallow trench isolation 18a is thus formed.

Chemical mechanical polishing removes an outstanding part of a deposition layer by applying chemical agent, that is, slurry to provide a chemical reaction, and by introducing a mechanical force to the chip on the polishing table. More specifically, the removing material on a chip is polished away by the reaction between the polishing pad on the polishing table and very abrasive particles in the slurry.

However, during polishing, a scratch or damage may be caused on the soft material by the particles. In the step planarizing an oxide layer 18 of chemical mechanical polishing for fabricating a shallow trench isolation 18a, since the oxide layer is soft, a micro-scratch 19 is easily formed on the surface thereof. Though the micro-scratch 19 is too fine to be observed by eyes, without mending the micro-scratch 19, a leakage current is introduced either by short of gates which is caused during defining a poly-silicon gate. The reliability and the yield of the circuit is therefore degraded.

Conventional, the micro-scratch is mended by two methods. One is to over etch a gate formed in the subsequent process. While over etching the gate, the gate material in the micro-scratch within the STI is etched and removed, so that the short through the gate material in the micro-scratch is eliminated. The drawback of this method is that the oxide layer in the source/drain region is etched simultaneously to cause a damage to the source/drain region. The other method is to improve the chemical mechanical polishing process. However, the chemical mechanical polishing is too difficult to control without the formation of a micro-scratch.

SUMMARY OF THE INVENTION

It is therefore an object of the invention to provide method to suppress the micro-scratch which is formed while fabricating a shallow trench oxide. By forming a thin dense sacrificial layer to fill the micro-scratch, and then etching back the sacrificial layer, the micro-scratch is mended. As a consequence, the short circuit and the leakage are avoided, so that the reliability of the device is improved.

To achieve these objects and advantages, and in accordance with the purpose of the invention, as embodied and broadly described herein, the invention is directed towards a method of fabricating a shallow trench isolation. A semiconductor substrate having pad oxide layer and a hard mask layer is provided. The pad oxide layer and the hard mask layer are defined to expose a part of the substrate. The exposed substrate is etched to form a trench therewithin. An isolation layer is formed to fill the trench. The isolation layer is planarized by chemical mechanical polishing with the hard mask layer as a stop layer, so that a micro-scratch is formed on a surface of the isolation within the trench. A sacrificial layer is formed on the isolation layer and the hard mask layer. The micro-scratch is thus filled with the sacrificial layer. The sacrificial layer is etched back. Since the etching rate of the sacrificial layer is lower than the isolation layer within the trench, the sacrificial layer filled within the micro-scratch is removed slower than the isolation layer. Therefore, the micro-scratch mended, and the quality of the device is improved.

It is to be understood that both the foregoing general description and the following detailed description are exemplary and explanatory only and are not restrictive of the invention, as claimed.

DESCRIPTION OF THE PREFERRED EMBODIMENTS

FIG. 2A to FIG. 2E show a method of fabricating a shallow trench isolation in a preferred embodiment according to the invention.

Figure 1A:
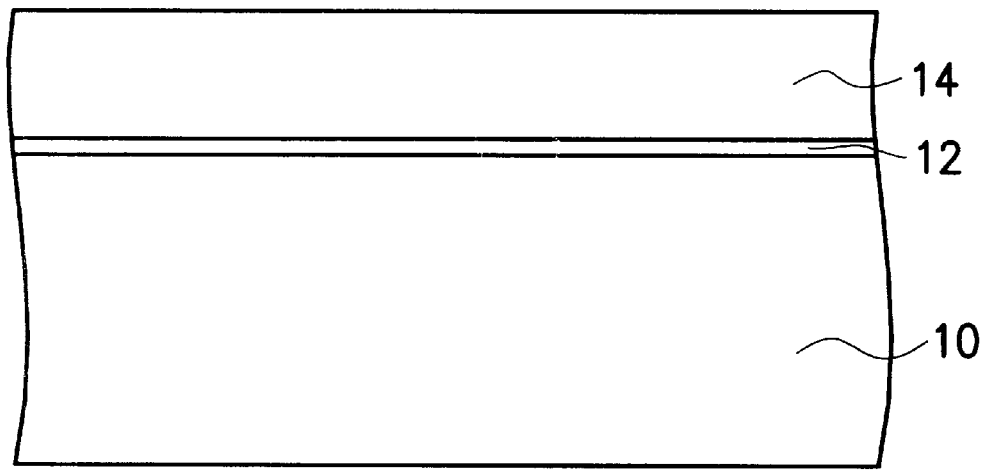
FIG. 1A to FIG. 1D are cross sectional views, of which a conventional method of fabricating a shallow trench isolation is shown.
Figure 1B:
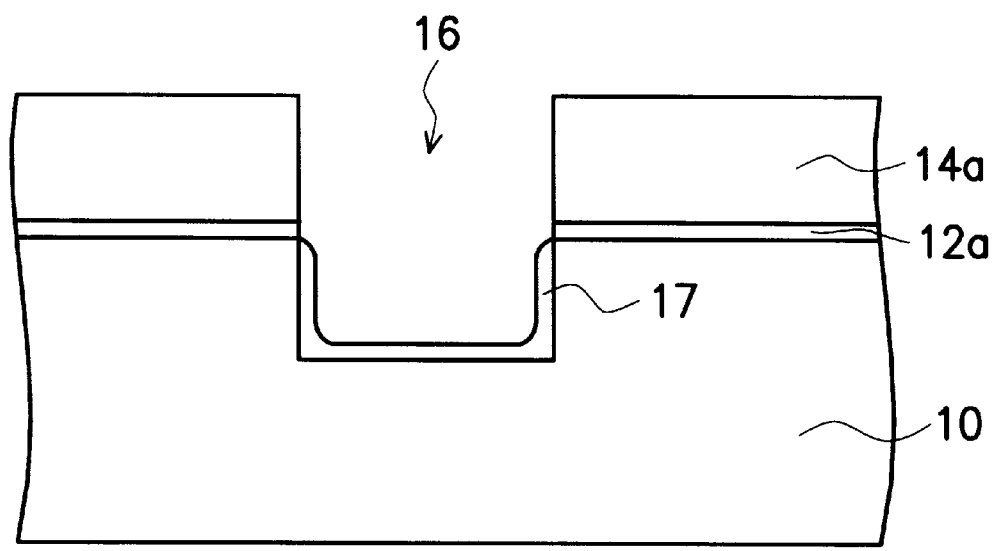
Figure 1C:
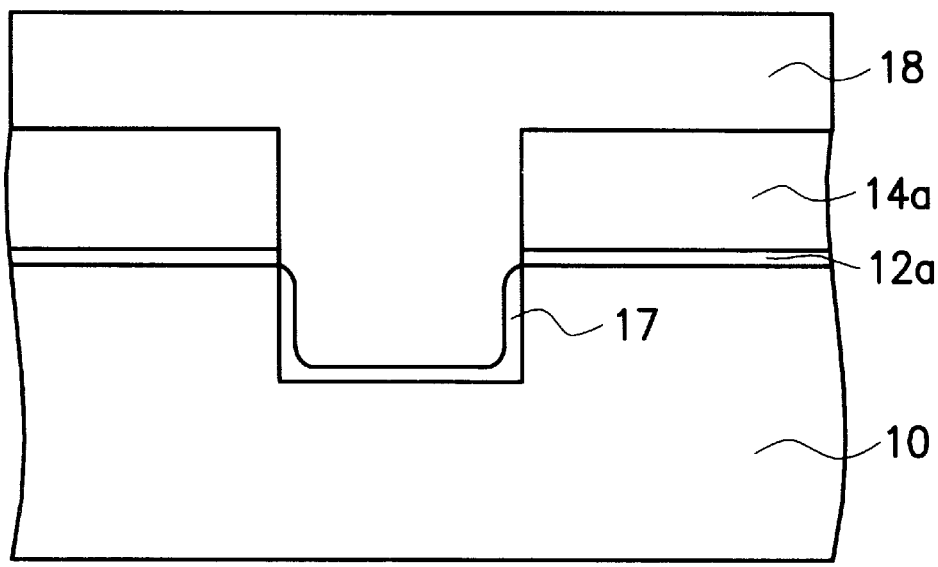
Figure 1D:
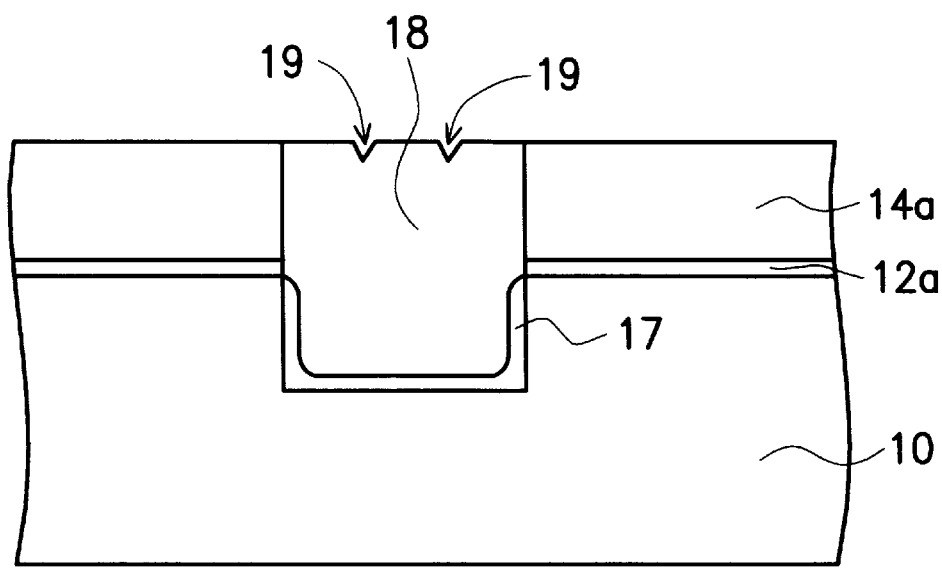
Figure 2A:
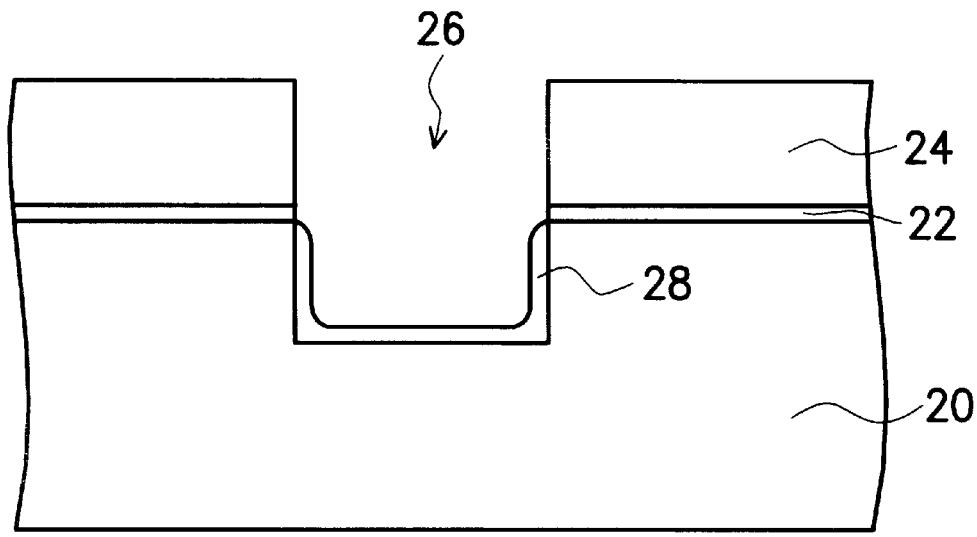
FIG. 2A to FIG. 2E are cross sectional views, of which a method of fabricating a shallow trench isolation in a preferred embodiment according to the invention is shown.

In FIG. 2A, on a semiconductor substrate 20, a pad oxide layer 22 and a hard mask layer 24, for example, a silicon nitride layer, are formed in sequence. Using photolithography and etching, the hard mask layer 24 and the pad oxide layer 22 are defined to expose a part of the substrate 20. The exposed substrate 20 is etched, so that a trench 26 is formed within the substrate 20. A liner oxide (not shown) is formed on a surface of the trench 26 by thermal oxidation.

Figure 2B:
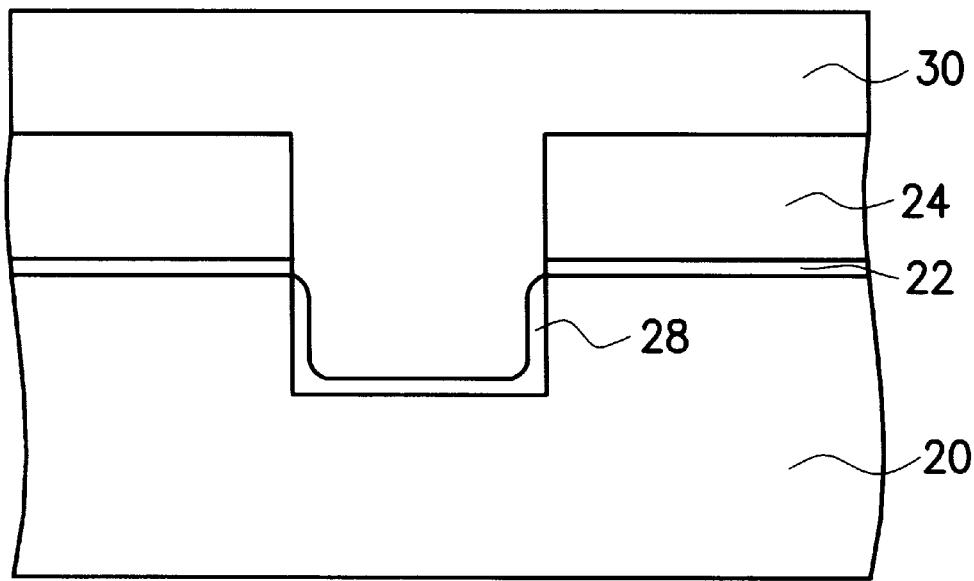
Figure 2C:
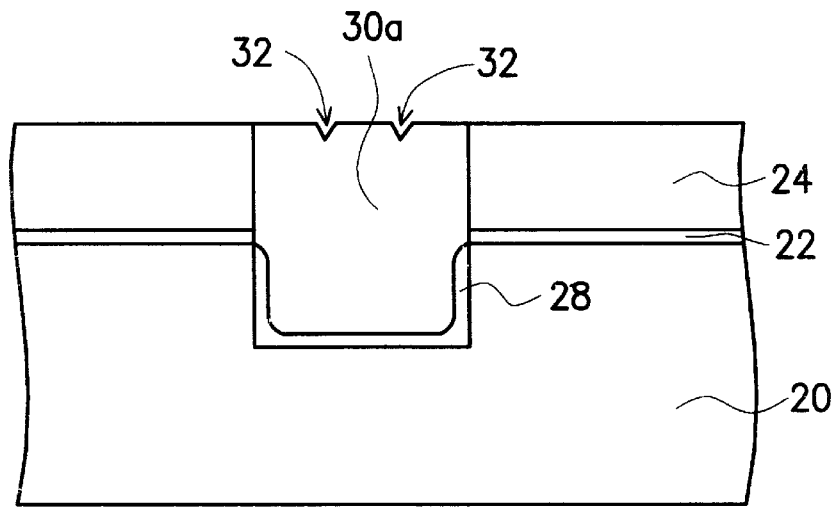

An isolation layer 30, for example, an oxide layer formed by atmosphere pressure chemical vapor deposition (APCVD), is formed on the hard mask layer 24 and fills the trench 26 as shown in FIG. 2B. Using chemical mechanical polishing, the isolation layer 30 is planarized with the hard mask layer 24 as a stop layer so that a micro-scratch 32 is formed on the resultant isolation layer 30a as shown in FIG. 2C.

Figure 2D:
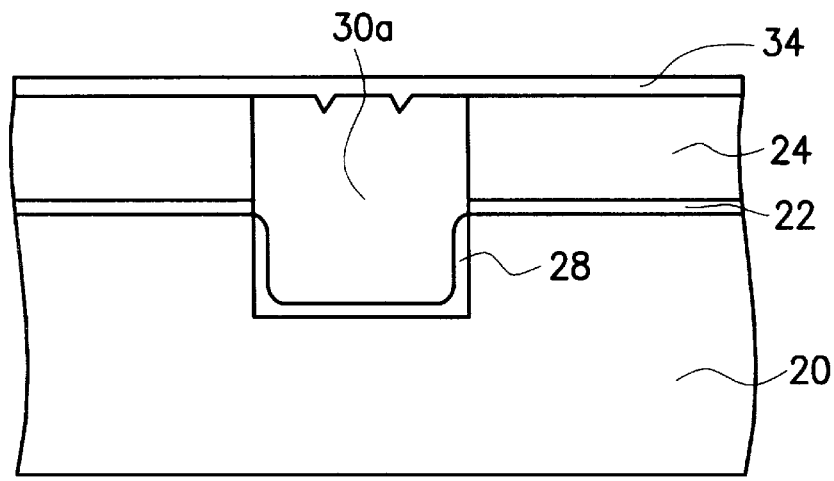
Figure 2E:
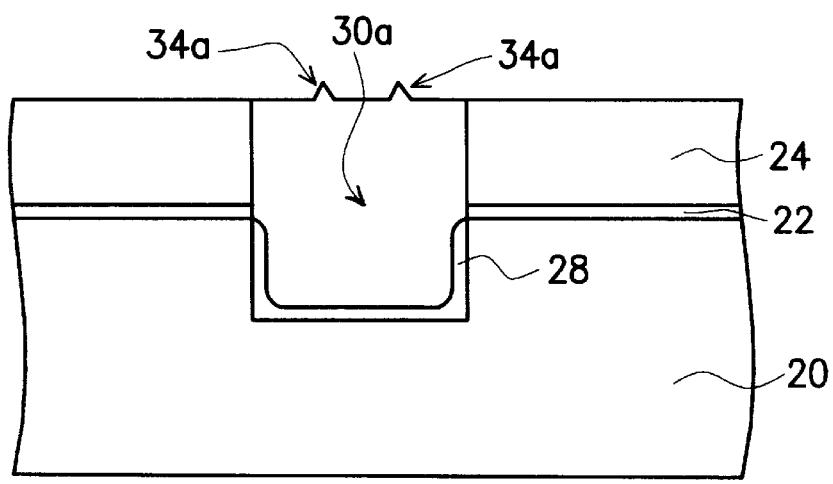

In FIG. 2D, a thin and dense sacrificial layer 34 is formed, for example, an oxide layer, a silicon nitride layer, or an poly-silicon layer to cover the hard mask layer 24 and the isolation layer 30a. The micro-scratch 32 is simultaneously filled by the sacrificial layer 34. Using wet etching or plasma etching, the sacrificial layer 34 is etched back by time or with the hard mask layer 24 as an etch stop. Since the etching rate of the sacrificial layer 34 is the same as or slower than the etching rate of the isolation layer 30*a*, the oxide level of micro-scratch area 34*a* is the same as or higher than the rest area of the oxide on the isolation region.

In the invention, applying the etching rate difference between the isolation layer and the sacrificial layer, the micro-scratch is mended to avoid the occurrence of a leakage current. The reliability is therefore improved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a shallow trench isolation, wherein a semiconductor having a hard mask layer formed thereon is provided, the method comprising:

defining the hard mask layer to expose a part of the substrate;

etching the exposed part of the substrate to form a trench;

forming an isolation layer on the hard mask layer and to fill the trench;

planarizing the isolation layer using chemical mechanical polishing with the hard mask layer as a stop layer, so that a micro-scratch is formed within the remaining isolation layer;

forming a sacrificial layer to cover the hard mask layer and the isolation layer and fill the micro-scratch; and etching back the sacrificial layer by time or with the hard mask layer as an etch stop, wherein the sacrificial layer has an etching rate slower than or equal to the isolation layer.

2. The method according to claim 1, wherein a pad oxide layer is further comprised between the substrate and the hard mask layer.

3. The method according to claim 1, wherein the sacrificial layer comprises a thin and dense layer formed by high density plasma chemical vapor deposition.

4. The method according to claim 1, wherein the sacrificial layer is etched back by wet etching.

5. The method according to claim 1, wherein the sacrificial layer is etched back by plasma etching.

6. A method of fabricating a shallow trench isolation, wherein a semiconductor having a hard mask layer formed thereon is provided, the method comprising:

defining the hard mask layer to expose a part of the substrate;

etching the exposed part of the substrate to form a trench after the step of defining the hard mask layer;

forming an isolation layer on the hard mask layer and to fill the trench;

planarizing the isolation layer using chemical mechanical polishing with the hard mask layer as an etch stop, so that a micro-scratch is formed within the remaining isolation layer;

forming a sacrificial layer to cover the hard mask layer and the isolation layer; and etching back the sacrificial layer by time or with the hard mask layer as an etch stop, wherein the sacrificial layer has an etching rate slower than or equal to the isolation layer.

7. The method according to claim 6, further comprising the step of forming a patterned pad oxide layer between the substrate and the hard mask layer before the step of etching the exposed part of the substrate to form a trench, so that the part of the substrate is exposed after the step of defining the hard mask layer.

* * * * *